United States Patent
Lammers et al.

(10) Patent No.: US 9,915,346 B2
(45) Date of Patent: Mar. 13, 2018

(54) PISTON RING

(71) Applicant: Federal-Mogul Burscheid GmbH, Burscheid (DE)

(72) Inventors: Ralf Lammers, Wermelskirchen (DE); Christiane Bauer, Burscheid (DE); Manfred Fischer, Leichlingen (DE); Jorg Vetter, Bergisch Gladbach (DE)

(73) Assignee: Federal-Mogul Burscheid GmbH, Burscheid (DE)

( * ) Notice: Subject to any disclaimer, the term of this patent is extended or adjusted under 35 U.S.C. 154(b) by 106 days.

(21) Appl. No.: 14/371,909

(22) PCT Filed: Jan. 14, 2013

(86) PCT No.: PCT/EP2013/050557
§ 371 (c)(1),
(2) Date: Jul. 11, 2014

(87) PCT Pub. No.: WO2013/104784
PCT Pub. Date: Jul. 18, 2013

(65) Prior Publication Data
US 2014/0353923 A1    Dec. 4, 2014

(30) Foreign Application Priority Data

Jan. 12, 2012  (DE) .......................... 10 2012 200 378

(51) Int. Cl.
*C23C 14/06*    (2006.01)
*C23C 14/32*    (2006.01)
(Continued)

(52) U.S. Cl.
CPC ............. *F16J 9/26* (2013.01); *C23C 14/0641* (2013.01); *C23C 14/325* (2013.01);
(Continued)

(58) Field of Classification Search
CPC . F16J 9/12; F16J 9/26; C23C 14/0641; C23C 14/325; C23C 28/044; C23C 28/42
See application file for complete search history.

(56) References Cited

U.S. PATENT DOCUMENTS 5,317,235 A * 5/1994 Treglio ................. C23C 14/325
                                                              118/723 VE
5,902,462 A * 5/1999 Krauss .................. C23C 14/325
                                                              204/192.38

(Continued)

FOREIGN PATENT DOCUMENTS

DE    102005033769 A1    1/2007
DE    102006046917 B3    2/2008

(Continued)

OTHER PUBLICATIONS

Mathesius, Krömmer, Praxis des thermischen Spritzens, Die Schweißtechnische Praxis (Band 37), pp. 106-108, ISBN 978-3-87155-552-7, DVS Media GmbH, Dusseldorf, 2009.

(Continued)

*Primary Examiner* — Nicholas L Foster
(74) *Attorney, Agent, or Firm* — Robert L. Stearns; Dickinson Wright, PLLC

(57) ABSTRACT

Disclosed is a piston ring (1) having a substrate (10) to which a wear resistant coating (20) is applied that includes at least one first element with a melting point $T_m \leq 700°$ C. The wear resistant coating (20) contains at least one second element with a melting point $T_m > 760°$ C. The wear resistant coating also includes droplets (30) which have a diameter (D) and which contain at least the first element, wherein at least 90% of the droplets (30) have a value 1 μm≤D≤10 μm. In the method for producing a wear resistant coating (20) using an arc evaporation technique, the target material includes at least one first element with a melting point $T_m \leq 700°$ C. and at least one second element with a melting (Continued)

Figure 1:
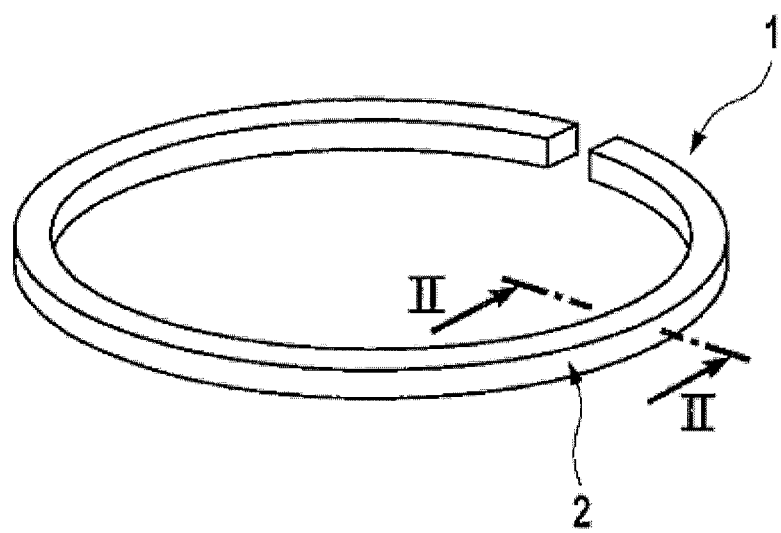

point $T_m > 760°$ C., wherein the quantity of the second material contained in the target material is such that the melting point ($T_m$) of the target material $\geq 1000°$ C.

14 Claims, 10 Drawing Sheets

(51) Int. Cl.
    *C23C 28/00*     (2006.01)
    *C23C 28/04*     (2006.01)
    *F16J 9/12*     (2006.01)
    *F16J 9/26*     (2006.01)

(52) U.S. Cl.
    CPC ............ *C23C 28/044* (2013.01); *C23C 28/42* (2013.01); *F16J 9/12* (2013.01)

(56) References Cited

U.S. PATENT DOCUMENTS

| | | | | |
|---|---|---|---|---|
| 6,033,768 | A * | 3/2000 | Muenz | C23C 14/0641 204/192.1 |
| 2002/0028342 | A1 | 3/2002 | Haug et al. | |
| 2005/0109607 | A1 * | 5/2005 | Ehiasarian | C23C 14/022 204/192.15 |
| 2005/0201921 | A1 * | 9/2005 | Vetter | B32B 19/00 423/414 |
| 2007/0116886 | A1 * | 5/2007 | Refke | C23C 4/10 427/446 |
| 2008/0298910 | A1 * | 12/2008 | Weber | C23C 14/0641 407/119 |
| 2009/0068450 | A1 * | 3/2009 | Muenz | C23C 14/0641 428/336 |
| 2009/0075114 | A1 * | 3/2009 | Hovsepian | C23C 14/022 428/650 |
| 2010/0044968 | A1 * | 2/2010 | Fischer | C23C 14/0641 277/443 |
| 2010/0044969 | A1 * | 2/2010 | Fischer | C23C 14/0641 277/443 |
| 2010/0187765 | A1 | 7/2010 | Hoppe et al. | |
| 2013/0036942 | A1 * | 2/2013 | Ramm | C23C 14/081 106/287.17 |
| 2013/0052477 | A1 * | 2/2013 | Lechthaler | C23C 14/0641 428/623 |
| 2013/0177361 | A1 * | 7/2013 | Waki | C23C 14/0664 407/115 |
| 2013/0200572 | A1 * | 8/2013 | Cha | F16J 9/26 277/442 |
| 2013/0214493 | A1 * | 8/2013 | Cha | C23C 14/0057 277/442 |
| 2013/0303414 | A1 * | 11/2013 | Ramm | C23C 14/0084 508/108 |
| 2014/0234654 | A1 | 8/2014 | Refke et al. | |
| 2015/0203777 | A1 * | 7/2015 | Ramm | C23C 14/024 508/103 |
| 2015/0308573 | A1 * | 10/2015 | Sato | F02F 5/00 277/443 |
| 2016/0298764 | A1 * | 10/2016 | Ciminelli Duarte De Souza | F16J 9/26 |
| 2016/0348228 | A1 * | 12/2016 | Rachbauer | C23C 14/0641 |

FOREIGN PATENT DOCUMENTS

| | | |
|---|---|---|
| DE | 102006046915 B3 | 3/2008 |
| DE | 102007035502 A1 | 2/2009 |
| EP | 0987339 A1 | 3/2000 |
| EP | 1260603 A2 | 11/2002 |
| EP | 1790742 A1 | 5/2007 |
| EP | 1790752 A1 | 5/2007 |
| WO | 9110760 A2 | 7/1991 |

OTHER PUBLICATIONS

Cathodic arc deposition, Wikipedia, available at https://en.wikipedia.org/wiki/Cathodic_arc_deposition, last accessed Feb. 19, 2016, pp. 1-3.

Thermal spraying, Wikipedia, available at https://en.wikipedia.org/wiki/Thermal_spraying, last accessed Feb. 19, 2016, pp. 1-9.

International Search Report, dated Jun. 28, 2013 (PCT/EP2013/050557).

Ducros C et al., "Mulilayered and nanolayered hard nitrite think films depositied by cathodic arc evaporation. Part 1: Deposition, morphology and microstructure," Surface and Coatings Technology, Elsevier, Amsterdam, NL, Bd. 201, Nr. 1-2, Sep. 12, 2006, pp. 136-142, XP024996452.

Ducros C et al., "Mulilayered and nanolayered hard nitrite think films depositied by cathodic arc evaporation. Part 2: Mechanical properties and cutting performances," Surface and Coatings Technology, Elsevier, Amsterdam, NL, Bd. 201, Nr. 3-4, Oct. 5, 2006, pp. 1045-1052, XP024996088.

Keutel K et al., "Modified Pulse Arc Deposition for Reducing of Droplet Emission," IEEE 18th Int. Symp. on Discharges and Electrical Insulation in Vacuum-Eindhoven—1998, pp. 562-565.

Schuelke T et al.,"Comparison of DC and AC arc thin film deposition techniques," Surface and Coatings Technology, Elsevier, Bd. 120-121, 1999, pp. 226-232.

* cited by examiner

PISTON RING

BACKGROUND OF THE INVENTION

1. Technical Field

The invention relates to a piston ring and a method for coating a piston ring.

2. Related Art

Highly-stressed sliding elements in engines and machines, for example, piston rings, are typically provided with wear protection layers on the running surface and/or on the ring flanks, to be able to meet the steadily further increasing demands on the service life. High cylinder pressures, direct injection, exhaust gas recirculation, and other design features of more recent engine developments such as alternative cylinder materials, new fuels, but also the minimization of oil consumption, increase the strain of the piston rings. Saving fuel is becoming increasingly important for environmental protection and the future raw material situation. An important measure for reducing fuel consumption is the minimization of the friction in the engine. Furthermore, it is important for environmental protection and the specified longer service lives of the engines to reduce the intrinsic wear of the piston ring and in particular the wear of the cylinder runways as much as possible, in order to maintain the exhaust gas limiting values.

Friction elements are already provided with wear protection layers, which are applied by means of thermal spraying methods, electroplating methods, or thin-film technology, or are formed by heat treatment and diffusion processes. These layers are typically restructured over their layer thickness and are applied substantially homogeneously.

To minimize the wear and to improve the fracture toughness (optimization of the ratio of hardness and toughness or ductility) and adhesion of these layers, multiple-ply systems are increasingly also being used.

The hardness of the multi layer system can achieve higher values than the hardness of the individual layers by way of the suitable selection of the individual layer thicknesses, which is dependent on the system. Multi layer systems made of aluminum nitride and chromium nitride, which are applied to piston rings, have very good wear properties (see DE 10 2006 046 917 A1) and also good thermal conduction properties and therefore good resistance against burn-trace formation and seizure (see DE 10 2007 035 502 A1).

The high thermal conductivity, and therefore the seizure resistance of layers which contain aluminum nitride, is embodied for optimum wear behavior of the layer as a multi layer system having chromium nitride. In the case of production-ready deposition by cathodic arc evaporation, aluminum droplets are incorporated in these layers, wherein these droplets are referred to as droplets or melt splashes.

Alloys having a thermal conductivity of at least 180 W/(m·K) are disclosed in DE 10 2007 035 502 A1. Such alloys can only have very small quantities of high-melting-point components in a low-melting-point component. These known layers do have good thermal conductivity values, however, droplets having very large diameters, which are predominantly in the range of 15 to 20 μm, are found in the alloys. The thermal conductivity of a layer applied by means of PVD method is dependent not only on the material, but rather also on the layer structure, growth defects, and the droplet content. Although titanium has a thermal conductivity of 16 W/(m·K) and aluminum has a thermal conductivity of 200 W/(m·K), the thermal conductivity of, for example, TiAl6V4 is only 6.3 W/(m·K) (at a temperature of 20° C.).

Reducing the droplet number by filtering the plasma or preventing the droplet deposition on the substrate is known from "Comparison of DC and AC arc thin film deposition techniques" in Surface and Coatings Techn. 20-21 (1999) 226-232 by Thomas Schülke et. al.

A modified pulse arc deposition method for droplet reduction is proposed in "Modified pulse arc deposition for reducing of droplet emission" in "IEEE 18$^{th}$ Int. Symp. On Discharges and Electrical Insulation in Vacuum" Eindhoven 1998 by K. Keutei et. al.

SUMMARY OF THE INVENTION

The object of the invention is to provide a piston ring having a wear protection layer, which both has lower intrinsic wear and also causes lower wear in the counter body. It is also the object of the invention to specify a method for producing such an improved wear protection layer for piston rings.

A wear protection layer can consist of a mono layer or a multi layer system having a plurality of individual layers.

The piston ring has a wear protection layer, which has at least one first low-melting-point element, whose melting point $T_m \leq 700°$ C. This layer additionally contains at least one second high-melting-element having a melting point $T_m > 760°$ C. The melting point of the first low-melting-point element is preferably less than 700° C., preferably less than 600° C., in particular less than 500° C. The lower limit for the melting point of the first low-melting-point element is at 100° C.

The melting point of the second high-melting-point element is preferably greater than 1000° C., particularly preferably greater than 1400° C., and in particular greater than 1500° C.

The first and second elements are preferably metals. Nonmetals, for example, silicon, can also be used as the second element.

In addition, droplets having a diameter D are present in this wear protection layer, these droplets containing at least the low-melting-point element, wherein at least 90% of the droplets have a value 1 μm≤D≤10 μm.

It has been shown that the droplets increase the roughness, so that post-processing is necessary to also reduce the wear of the counter runner. In addition, during machining of the surface or during the use of piston rings in the engine the respective points of the coating can break out. It has been shown that the size of the droplets has a decisive influence on the wear of a wear protection layer and a running partner.

Small droplets, i.e., in the range from 1 μm≤D≤10 μm, are advantageous. The effort for the post-processing can be substantially reduced by shrinking the droplets, because the roughness also decreases with decreasing droplet size. The breaking out of surface regions in which droplets are found is also significantly minimized.

A further advantage is that droplets dissipate the internal stresses of a coating, without having a harmful influence on the layer structure. Small droplets result in the positive effect that internal stresses can be dissipated to a certain extent. If larger droplets are incorporated in the layers, a larger part of the internal stresses can be dissipated by the larger volume of the droplets. However, large droplets having a diameter D>10 μm have the disadvantage that the intrinsic wear and the counter body wear in an engine, for example, increases. Minimal inhomogeneities are generated in the coating by the small droplets, which contribute to the stress dissipation.

Micro-lubrication pockets, which are homogeneously distributed, arise due to the small droplets by way of the post-processing.

The order of magnitude of the micro-lubrication pockets and the distribution thereof positively influence the tribological properties of the coating, which is expressed in lower wear of the counter body in particular, for example, a cylinder running surface.

The diameter D of the droplets is the diameter of the envelope curve of the droplets, wherein the diameter D is measured in a plane perpendicular to the substrate normal.

It is preferable for at least 90% of the droplets to have a value 1 µm≤D<8 µm, in particular a value 1 µm≤D<6 µm.

The droplets cannot be entirely prevented due to the method, but their size—as explained in conjunction with the method according to the invention—can be intentionally set.

Surprisingly, it has been shown that if at least 90% of the droplets have a value D≤10 µm, the wear of the wear protection layer significantly decreases. The wear can be reduced by up to 50% in relation to the layers having droplets which lie outside this condition.

The first low-melting-point element preferably consists of aluminum ($T_m$=660° C.). Aluminum has the advantage that the wear protection layer has higher oxidation resistance and a high thermal conductivity. Further low-melting-point elements are magnesium ($T_m$=639° C.), zinc ($T_m$=420° C.), tellurium ($T_m$=449° C.), thallium ($T_m$=303° C.), tin ($T_m$=232° C.), bismuth ($T_m$=271° C.), or sulfur ($T_m$=113° C.).

The second high-melting-point element preferably consists of titanium ($T_m$=1660° C.), vanadium ($T_m$=1890° C.), chromium ($T_m$=1875° C.), zirconium ($T_m$=1852° C.), niobium ($T_m$=2468° C.), molybdenum ($T_m$=2617° C.), hafnium ($T_m$=2150° C.), tantalum ($T_m$=2996° C.), tungsten ($T_m$=3390° C.), iron ($T_m$=1534° C.), silicon ($T_m$=1410° C.), or cerium ($T_m$=797° C.).

It has been shown that the droplet size, in particular in layers which consist of at least one metal nitride, has a substantial influence on the wear of such layers and the counter runners thereof. A metal nitride also comprises nitrides of two or more metals.

The wear protection layer preferably consists of a periodically constructed multi layer system. Each periodicity preferably consists of at least two individual layers made of metal nitride. It is preferable for all individual layers of the multi layer system to consist of nitrides.

At least one individual layer of each periodicity has at least one of the low-melting-point elements and at least one of the high-melting-point elements. It has been shown that a multi layer system made of metal nitride layers has good wear resistance. The wear resistance can be improved still further in conjunction with the mentioned droplet size.

The individual layers preferably have nitrides of at least one metal from the group titanium (Ti), zirconium (Zr), hafnium (Hf), vanadium (V), niobium (Nb), tantalum (Ta), chromium (Cr), molybdenum (Mo), tungsten (W), iron (Fe), silicon (Si), or cerium (Ce).

Fundamentally, all combinations of the mentioned first low-melting-point and second high-melting-point elements are possible, wherein the nitrides of these combinations are preferred. For example, in one periodicity, an individual layer made of a nitride of a low-melting-point element can be combined with an individual layer made of a nitride of a low-melting-point element and a high-melting-point element. Instead of a individual layer made of a nitride of a low-melting-point element, an individual layer made of a nitride of a low-melting-point element can also be combined with an individual layer made of a nitride of a high-melting-point element and a low-melting-point element. These can be stoichiometric phases or non-stoichiometric phases or mixtures thereof. For example, CrN is to be understood as one or more phases made of the system Cr—N, this applies similarly to the other systems. Depending on the coating method, one or another combination can possibly be preferable.

The use of CrN is particularly preferable for at least one individual layer of the periodicity. CrN-individual layers can be combined in the multi layer system with individual layer of the nitrides of all other metals of the mentioned groups.

One preferred individual layer combination in a periodicity is CrN/AlTiN.

The periodicity of the multi layer system preferably consists of at least two individual layers made of AlTiN and CrN having 47 to 55 wt.-% Cr, 19 to 25 wt.-% N, 10 to 19 wt.-% Al, and 10 to 14 wt.-% Ti, wherein the wt.-% specifications relate to the wear protection layer.

A possibly present small oxygen proportion, which is to be considered a contaminant, and which lies in the range of a few at.-%, was not considered.

The periodicity can also have more than two individual layers, preferably up to four individual layers. Two individual layers are preferable because the production expenditure significantly increases with increasing individual layer number per periodicity.

The high-melting-point element in a mono layer or an individual layer of the periodicity is preferably contained at a proportion of 1 to 90 wt.-%, particularly preferably 20 to 40 wt.-%. The proportion of the high-melting-point element is dependent on the melting points of the low-melting-point and the high-melting-point elements.

It has been shown that depending on the type of the high-melting-point element, small quantities are already sufficient to significantly reduce the droplet size. The droplet size or the distribution of the droplet size can be set intentionally via the proportion of the high-melting-point element—for identical method parameters. The greater the proportion of the high-melting-point element is in comparison to the proportion of the low-melting-point element, the smaller are the droplets and the smaller is the proportion of the droplets in the applied wear protection layer. It is to be considered in this case that the method parameters also have an influence on the droplet size.

The wear protection layer is preferably applied by means of an arc evaporation method, preferably a cathodic arc evaporation method, in particular a filterless arc evaporation method. The method is preferably filterless, i.e., target sprays of a specific size are not sorted out before the deposition.

The thickness of an individual layer is, for the construction of the layer as a superlattice, preferably 5 nm to 15 nm, particularly preferably 8 nm to 15 nm, more particularly preferably 10 nm to 15 nm.

The thickness of an individual layer is, for the construction of the layer as a multi layer system, preferably 15 to 500 nm, particularly preferably 30 to 200 nm, more particularly preferably 30 to 80 nm.

It has been shown that there is an optimum value for the periodicity with respect to the wear resistance for each material combination of the individual layers.

The thickness of the wear protection layer is preferably 10 µm to 60 µm, particularly preferably 20 µm to 60 µm, and in particular 30 µm to 40 µm.

Preferred uses of the piston ring according to the invention are provided in internal combustion engines, in particular for diesel engines or gasoline engines.

The method according to the invention provides that the wear protection layer is deposited on a substrate by means of an arc evaporation method, in which at least one target material is located in at least one target, wherein this target material is vaporized, and is deposited in a gas atmosphere onto the substrate, wherein the target material has at least one first element having a melting point $T_m \leq 700°$ C. and at least one second element having a melting point $T_m > 760°$ C., wherein the second element is contained in the target material in a quantity such that the melting point of the target material is $T_m \geq 1000°$ C.

For the method, it is necessary for the first and the second elements to be located jointly in a target, in contrast to the prior art, so that both elements are jointly vaporized or melted. The target is, for example, a material plate consisting of the target material.

It has been shown that even small quantities of such a second element significantly increase the melting point of the alloyed target material and in the case of a higher melting temperature of the target material, fewer and smaller droplets are formed, so that the desired droplet size or the distribution thereof can be set via these parameters.

The proportions of the second element in the target material of the target are preferably 1 to 90 wt.-%, particularly preferably 40 to 50 wt.-%.

The preferred arc evaporation method is a cathodic arc evaporation method. This method has the advantage that high growth rates can be achieved thereby, which is advantageous for an industrial use.

Aluminum is preferably used as the first element. Other first elements are: magnesium, zinc, tellurium, thallium, tin, bismuth, or sulfur.

Titanium is preferably used as the second element. Further second elements can be vanadium, chromium, zirconium, niobium, molybdenum, hafnium, tantalum, tungsten, iron, silicon, or cerium, which were mentioned in conjunction with the piston rings according to the invention.

Nitrogen is preferably used as a reactive gas to generate the metal nitrides.

The pressure of the reactive gas is preferably set to 1 to 10 Pa.

The vaporizer current is preferably set to 40 to 200 A.

The bias voltage is preferably set to 5 to 200 V.

The following target material compositions are preferred:

| first element | second element | preferred proportion | particularly preferred proportion |
|---|---|---|---|
| aluminum remainder | Ti ≥1 wt. % | ≥2 wt. % | 40-50 wt. % |
| aluminum remainder | V ≥3 wt. % | 3-50 wt. % | 3-4 wt. % |
| aluminum remainder | W ≥2 wt. % | 2-43 wt. % | 2-3 wt. % |
| aluminum remainder | Zr ≥1 wt. % | 6-86 wt. % | 1-2 wt. % |
| aluminum remainder | Fe ≥4 wt. % | 17-83 wt. % | 4-8 wt. % |
| aluminum remainder | Fe ≥4 wt. % | | 12-67 wt. % |
| aluminum remainder | Ce ≥20 wt. % | | 33-88 wt. % |

If the mentioned lower limits of the weight proportions are maintained for the second element, the droplet size and the droplet distribution according to the invention are achieved.

The composition of the respective deposited layer generally deviates from the composition of the target material, because nitrogen, for example, is incorporated as a nitride in the layer due to the reactive gas, on the one hand, and slight deviations can be caused by the selection of the method parameters, on the other hand.

In a preferred example having Ti at 40-50 wt.-% and the remainder Al, a melting temperature of approximately 1400° C. is achieved, so that in the case of a deposition by means of the arc evaporation method, this results in droplets, of which at least 90% are in a range in the vicinity of the lower limit of the value range 1 μm≤D≤10 μm. Targets having this preferred composition are available at economically profitable costs.

THE DRAWINGS

Exemplary embodiments of the invention will be explained in greater detail hereafter on the basis of the drawings.

Figure 2:
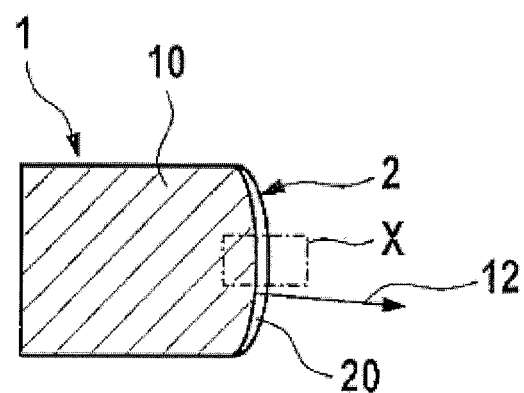
Figure 3:
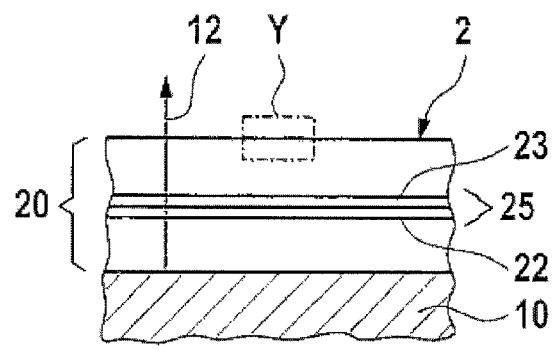
Figure 4:
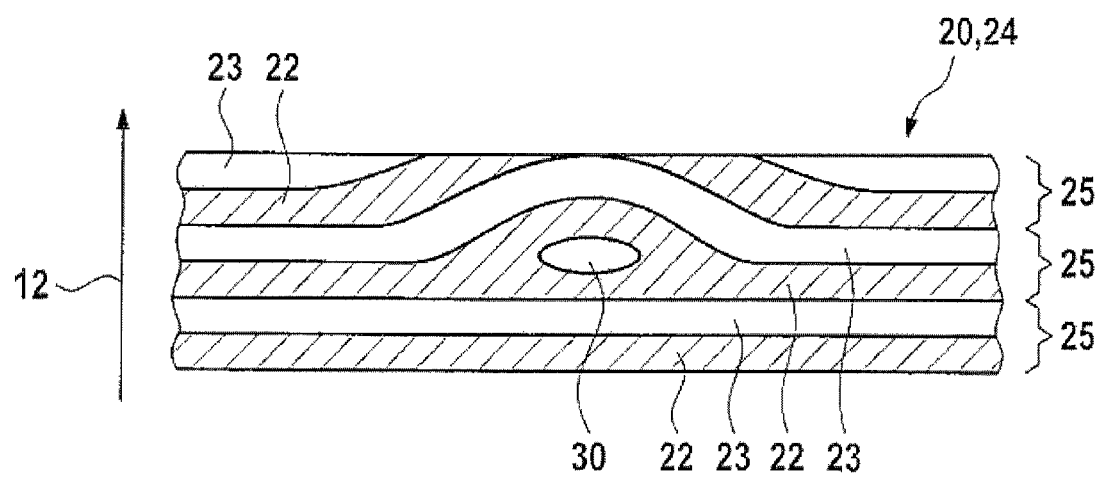
Figure 5:
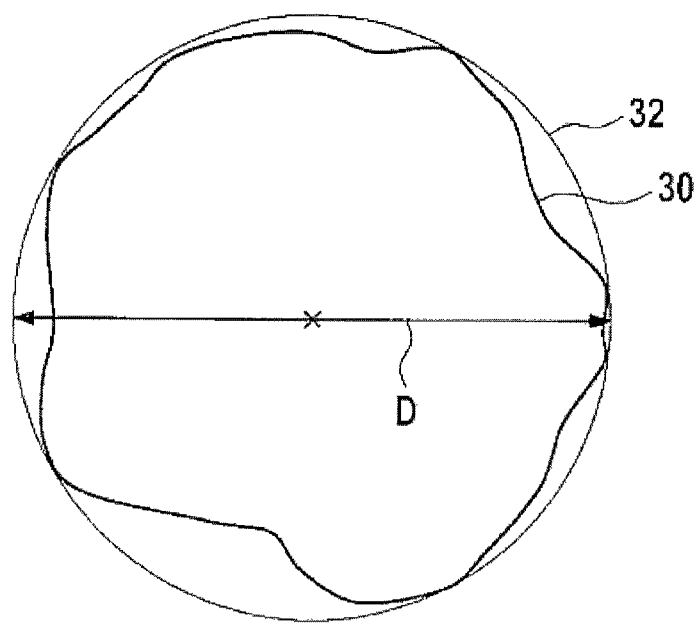
Figure 6:
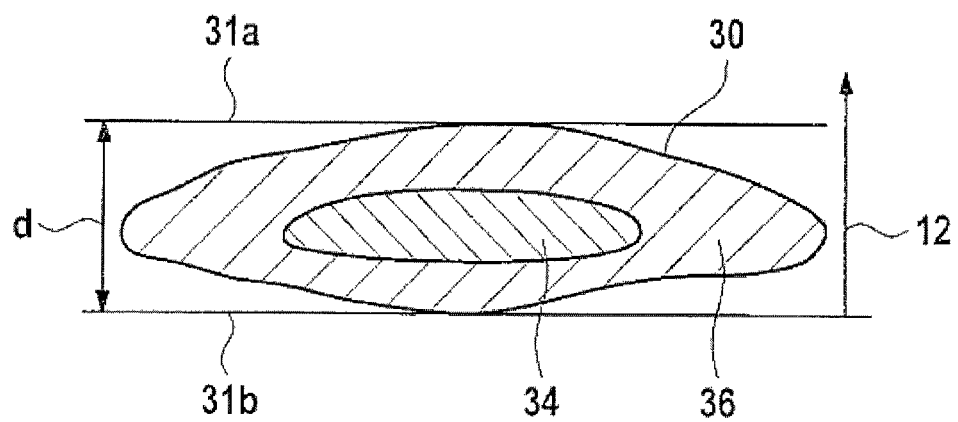
Figure 7:
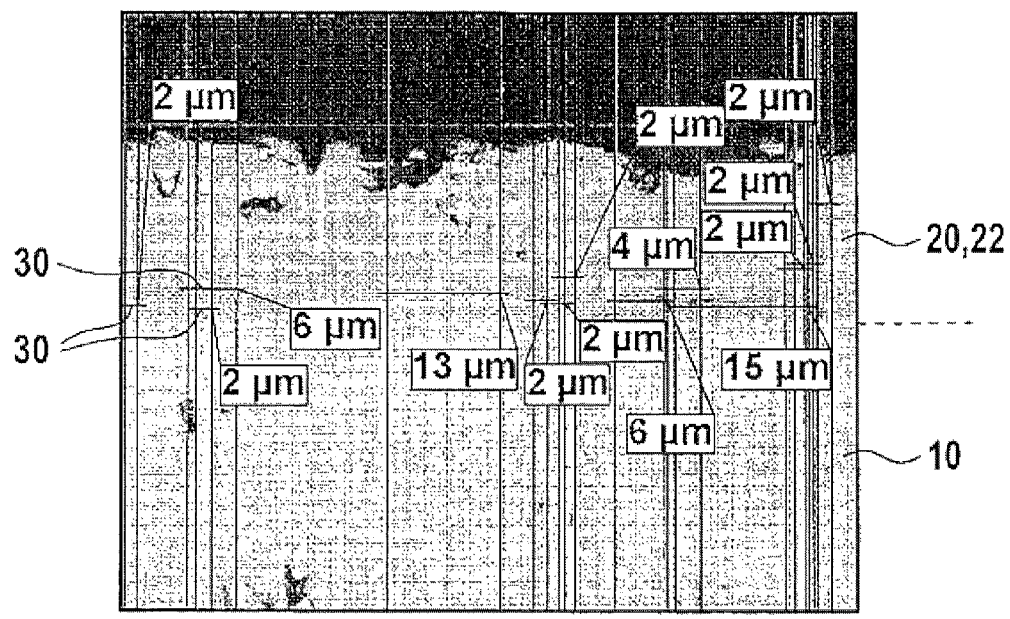
Figure 8:
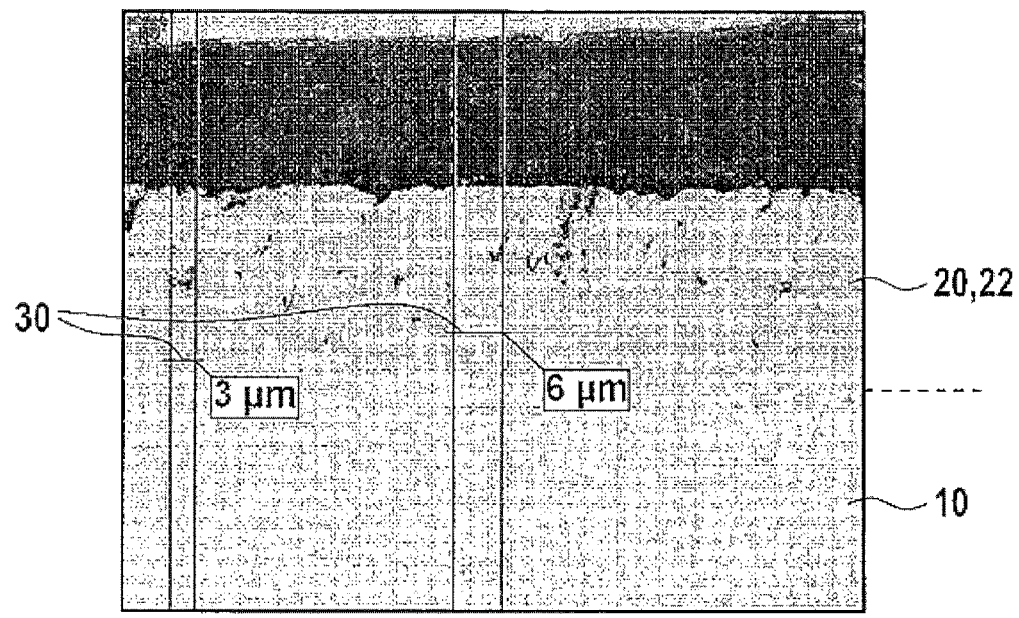

In the figures:

FIG. 1 shows a piston ring in a perspective illustration,

FIG. 2 shows a section along line II-II through the piston ring shown in FIG. 1, FIG. 3 shows an enlarged illustration of the detail X from FIG. 2, FIG. 4 shows an enlarged illustration of the detail Y from FIG. 3, FIGS. 5 and 6 show a top view and a cross section through a droplet, FIG. 7 shows a microsection of a coating and a substrate at 1000-fold enlargement, wherein the coating is produced by means of an aluminum cathode, FIG. 8 shows a microsection of a coating and a substrate at 1000-fold enlargement, wherein the coating is produced by means of an AlTi cathode.

Figure 9:
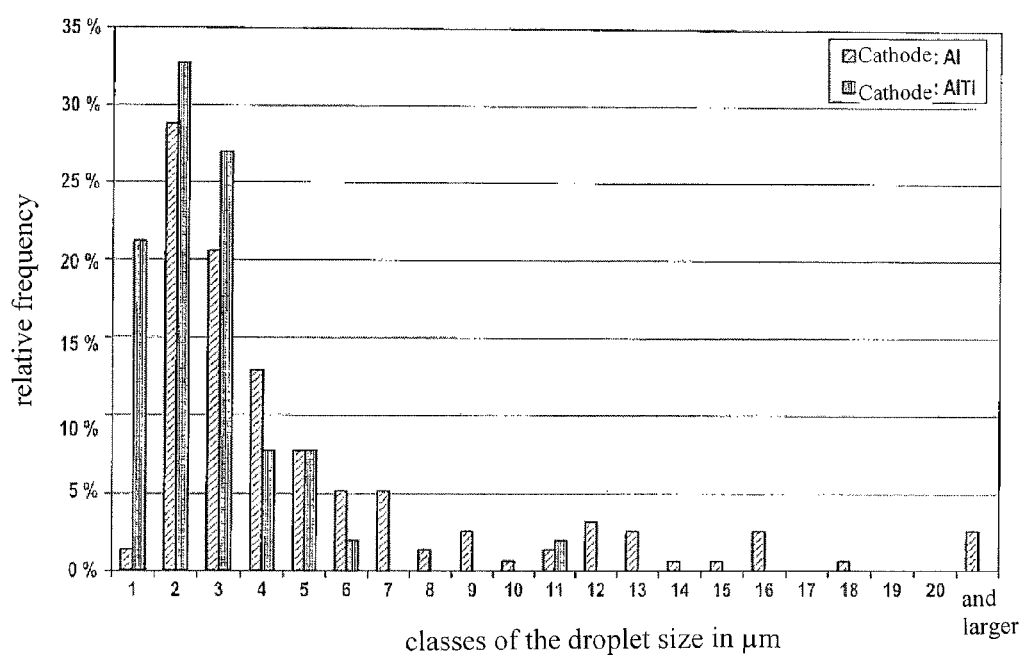
Figure 10:
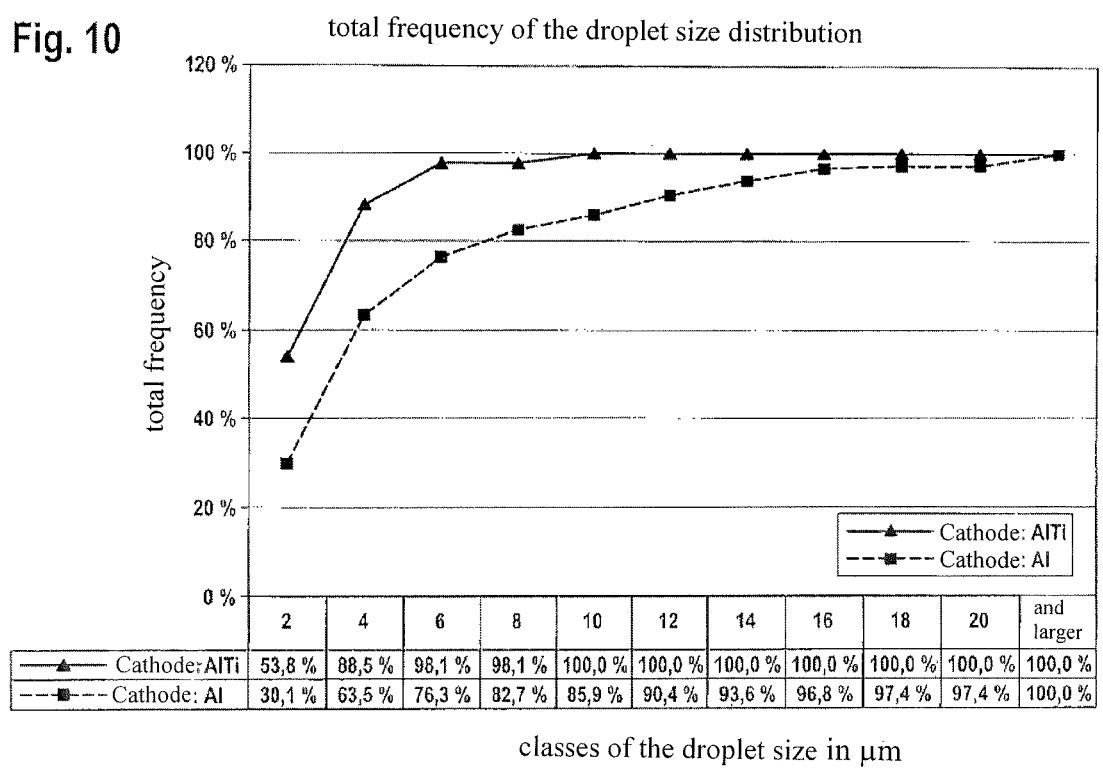
Figure 11:
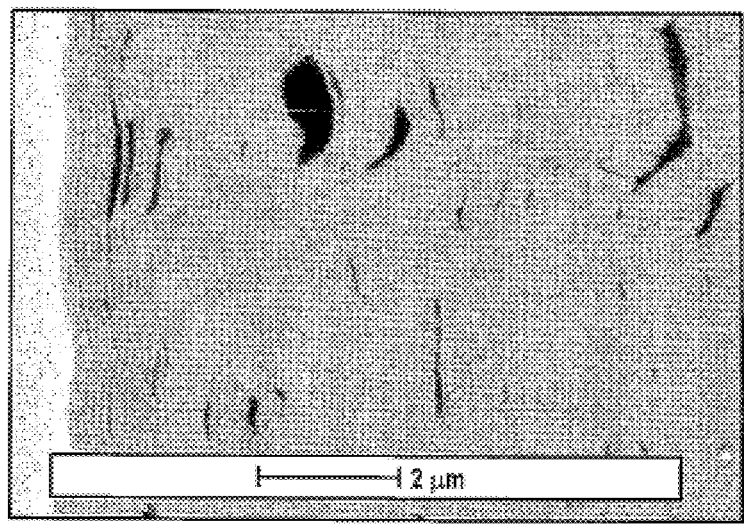
Figure 12:
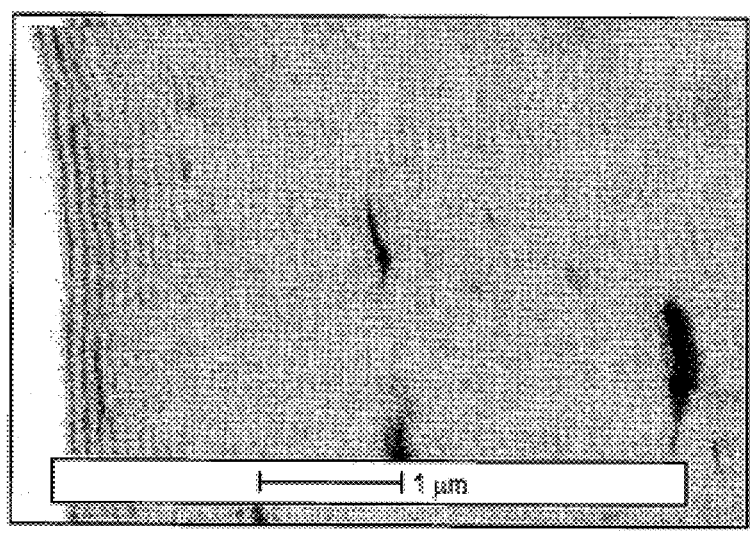
Figure 13:
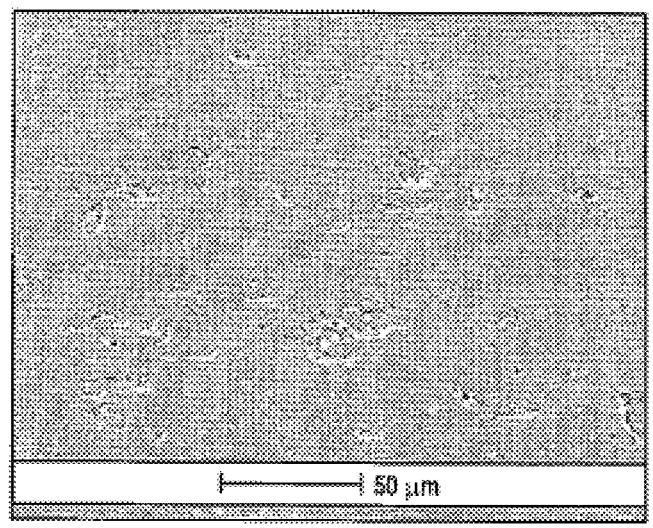
Figure 14:
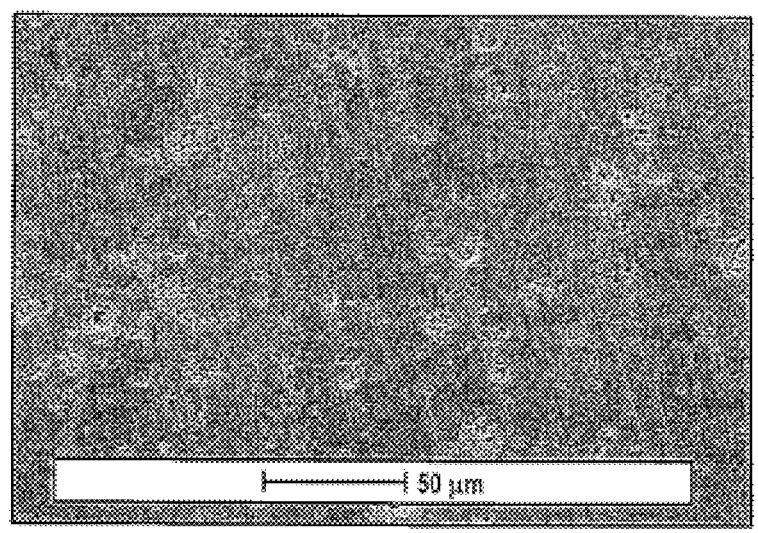
Figure 15:
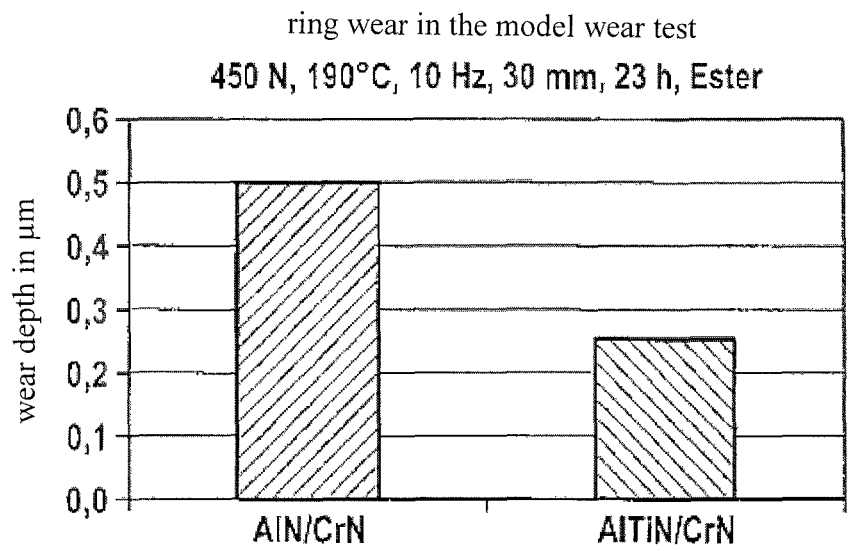
Figure 16:
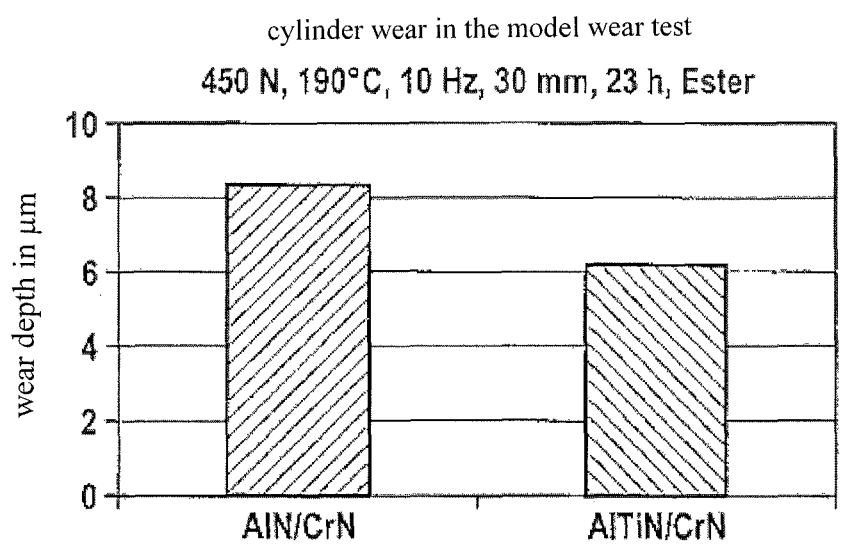
Figure 17:
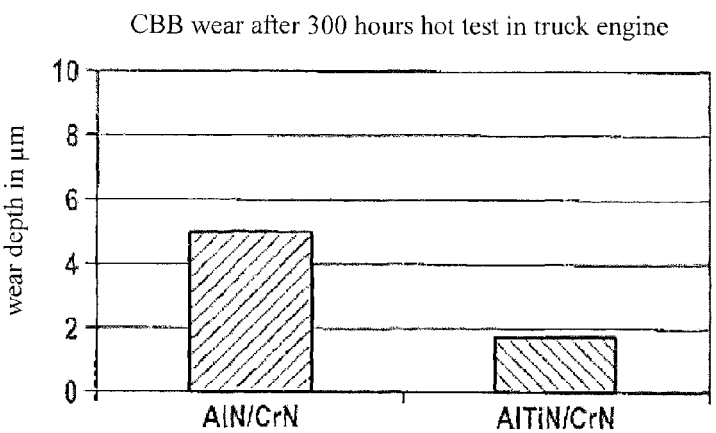
Figure 18:
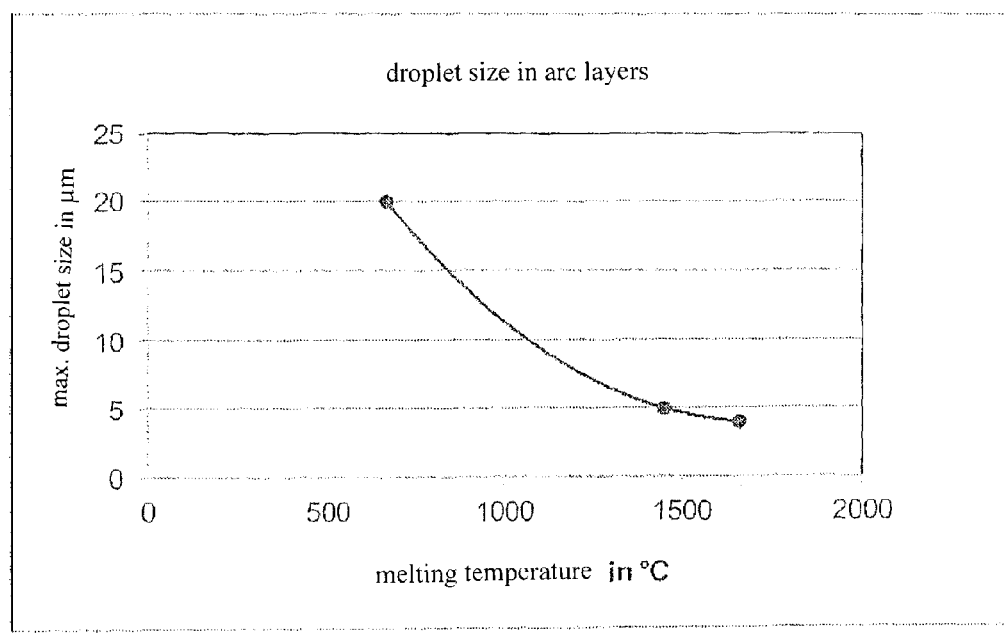

FIG. 9 shows a graph which shows the frequency distribution of the droplets,

FIG. 10 shows a graph which shows the total frequency of the droplet distribution, FIG. 11 shows a SEM picture of an aluminum nitride/chromium nitride layer, in which the chromium droplets are shown in white and the aluminum droplets are shown in black, FIG. 12 shows a SEM picture of a multi layer system, wherein the AlN layers contain titanium, FIG. 13 shows a top view of an aluminum nitride/chromium nitride layer having breakouts after the surface processing, FIG. 14 shows a top view of an aluminum-titanium nitride/chromium nitride layer having breakouts after the surface processing, FIG. 15 shows a graph which shows the wear values of a conventional AlN/CrN multi layer system in comparison to an AlTiN/CrN multi layer system according to the invention, FIG. 16 shows a graph which shows the associated cylinder wear values, FIG. 17 shows a diagram which shows the cylinder wear values after a running engine, FIG. 18 shows a graph which shows the maximum droplet sizes as a function of the melting temperature of the materials used.

DETAILED DESCRIPTION

FIG. 1 shows a piston ring 1 in perspective. The external peripheral surface forms the running surface 2.

FIG. 2 shows a section along line II-II through the piston ring 1 shown in FIG. 1. The running surface 2 has a slightly crowned shape. The wear protection layer 20 deposited on the substrate 10 reproduces this crowned shape.

An enlarged illustration of the detail X from FIG. 2 is shown in FIG. 3. A wear protection layer 20 made of a multi layer system, which is formed from a plurality of periodicities 25, is located on the substrate 10. Each periodicity 25 consists of two individual layers 22, 23, wherein only one periodicity 25 is shown for the sake of comprehensibility.

An enlarged illustration of the detail Y from FIG. 3 is shown in FIG. 4. A droplet 30 is schematically shown in one of the individual layers 22. Such a droplet 30 causes bulging of the layer 32, which continues through the further individual layers lying above it and is partially reinforced. The upper individual layers 22 and 23 are cut into by the surface processing, whereby the surface roughness caused by the bulging is reduced, but attack surfaces result due to the cutting, which can result in breakouts of the coating material via the droplet 30.

A droplet is shown in a top view in FIG. 5. The plane is shown which is perpendicular to the substrate normal 12, which is shown in FIGS. 3 and 4. The diameter D of the droplet 30 is defined on the basis of the envelope circle 32.

A section through a droplet according to FIG. 5 is shown in FIG. 6. For example, if aluminum nitride has been deposited for the production of the respective layer 22 of FIG. 4, the droplet 30 has a core 34 made of aluminum and a droplet envelope 36 made of AlN. The thickness d is defined via the spacing of the two planes 31a, 31b, which are perpendicular to the substrate normal 12 and delimit the droplet.

A substrate 10 having a wear protection layer 20 according to the prior art applied thereon is shown in FIG. 7. The wear protection layer consists of a multi layer system. The wear protection layer 20 was applied by means of an arc evaporation method, wherein the two cathodes (targets) consist of chromium and/or aluminum. The layer consists of AlN/CrN.

It can be seen that a broad distribution of AlN droplets is provided with respect to their diameter D, wherein some droplets have a diameter of 13 or 15 µm. In addition, CrN droplets are present, which are significantly smaller and therefore can be neglected.

In comparison thereto, a substrate 10 having a wear protection layer 20 according to the invention is shown in FIG. 8, wherein the wear protection layer was produced from a multi layer system by means of arc evaporation of cathodes (targets). One target consists of Al and Ti, while the other target consists of Cr. The layer 20 consists of TiAlN/CrN.

Description of the Coating Method:

The arc evaporation is a form of physical vapor deposition (PVD) technology. In this method, the vaporization material, which must be electrically conductive, is introduced as a solid plate (target) in an arbitrary arrangement into a vacuum chamber and wired as a cathode. An electric arc arises by applying a voltage between an anode and the cathode. The electric arc moves over the cathode and vaporizes ultra-small quantities of material. The vaporizer power is set by the vaporizer current. As a result of the high energy density, the material vaporizes directly, without forming a large-area melt. A bias voltage is applied between the vacuum chamber and the substrate, whereby the metal ions are accelerated in the direction of the substrate to be coated. The metal ions react therein with an introduced reactive gas (for example, nitrogen) and are deposited as a thin nitridic hard material layer on the substrate. A highly concentrated plasma in the form of a vapor lobe forms, through which the substrate to be coated is guided.

It has been shown that specific process conditions result in an ideal incorporation of the droplets:

Current
  Adaptation of the discharge conditions in the coating process in the case of targets having diameter of 100 mm: vaporizer currents: 40 to 200 A
  The vaporizer currents in the case of this vaporizer geometry are preferably at 50 to 150 A, in particular at 80 to 90 A.
  In the case of very high vaporizer currents, emissions of larger droplets occurs and the number of the droplets rises due to an increase of the cathode temperature.
  In the case of very low vaporizer currents, the vaporization process becomes more unstable, so that it must be frequently reignited. This has the disadvantage that large droplets are emitted during the ignition phase.
Pressure
  Reactive gas pressure: 1 to 10 Pa nitrogen, preferably 2 to 8 Pa
  In the case of very low reactive gas pressures of 0.1 to 0.9 Pa, an emission of larger droplets occurs and the number of the droplets increases.
  In the case of very high pressures >10 Pa to 50 Pa, the ions are thermalized. Thermalization means the adaptation of the particle speeds to the environment by impacts.
  Bias voltages 5 to 200 V, preferably 5 to 50 V, in particular 5 to 20 V.

On the exemplary embodiment:
Composition of the Target Material Used:

| Target composition | | |
|---|---|---|
| | at. % | wt. % |
| Al | 67 | 53.4 |
| Ti | 33 | 46.6 |

The layer was deposited as a multi layer system on piston rings:
  structure/CrN/AlTiN
  individual layer thicknesses between 40 and 80 nm (periodicities 80-160 nm)
  element composition of the multi layer system (CrN+ AlTiN single plies).

| | at. % | wt. % |
|---|---|---|
| Cr | 24-28 | 47-55 |
| N | 52-57 | 19-25 |
| Al | 9-13 | 10-19 |
| Ti | 4-7 | 10-14 |
| O | 0-3 | — |

In the case of the specification in wt.-%, the oxygen content was neglected. The wt.-% specifications relate to the entirety of the wear protection layer.
Internal stresses in the deposited layers:
CrN/AlN: −0.94 GPa; CrN/AlTiN: −1.08 GPa
The internal stresses in the deposited layers are somewhat less with large droplets (CrN/AlN), since the larger droplets can dissipate the internal stresses to a greater extent as a result of the larger volume proportion of the droplets. The internal stresses were measured by means of x-ray diffraction on the deposited layers according to the sin² (ψ) method by means of x-ray diffraction. A negative sign indicates pressure internal stresses.

A significant reduction of the number and also the diameter of the aluminum-containing droplets 30 could be achieved by the addition of the titanium to the target material. Two droplets having the diameter D of 3 μm and 6 μm are identified as examples.

The frequency distribution of the droplets for the layers shown in FIGS. 7 and 8 is shown in FIG. 9. It can be seen that the AlN/CrN layer also contains a comparatively large proportion of droplets in the range >10 μm. In the range <10 μm, the proportion of the droplets in the TiAlN/CrN layer is greater than in the AlN/CrN layer. The frequency distribution of the droplets has significantly changed due to the addition of titanium to the target material aluminum, which results in an improvement of the surface roughness and a reduction of the wear of both the wear protection layer and also the counter runner.

The associated total frequency from FIG. 9 is shown in FIG. 10. It can be seen that the number of the droplets having a diameter D of ≤10 μm is 100% for the layers deposited using the AlTi cathode, and even the proportion of the droplets having a diameter D≤6 μm is still at 98.1% and therefore greater than 90%.

SEM pictures are shown in FIGS. 11 and 12. It can be seen that significantly smaller aluminum nitride droplets are incorporated in the layer (FIG. 12) in comparison to the layers according to FIG. 11. In the illustrations, the chromium nitride droplets appear white and the aluminum nitride droplets appear in black. It can be seen that a reduction of the droplet size has occurred due to the addition of titanium (see FIG. 12).

This results in significantly smoother finish-processed piston ring running surfaces, as shown in FIGS. 13 and 14. FIG. 13 shows the processed surface of a conventional aluminum nitride/chromium nitride coating having the breakouts after the processing. The breakouts are smaller and significantly fewer if titanium is added to the aluminum. FIG. 14 shows a layer system made of aluminum titanium nitride/chromium nitride. A significant improvement with respect to the breakouts is thus achieved.

As a result, tribological model tests (coated piston ring segments against segments made of cylinder bearing bushings) in FIGS. 15 and 16 show both less intrinsic wear (wear of the piston ring in FIG. 15) and also less counter body wear (cylinder wear in FIG. 16). The wear on the piston ring could be reduced by 50% and the wear on the cylinder could be reduced by approximately 25%.

The test was carried out in the experimental setup for studying the oscillating friction wear. The parameters are: normal force 450 N, temperature 190° C., travel 30 mm, duration 23 hours, lubricant ester.

The results of the wear measurement on cylinder bearing bushings (CBB) after a 300-hour test in a truck engine under aggravated test conditions (this is to be understood to mean: The coolant water is regulated to 105° C. instead of approximately 90° C., the engine was operated over 9/10 of the time at maximum torque, and the remainder of the time at nominal power) confirmed the significant reduction of the counter body wear. The wear reduction is also approximately 50% here, as shown in FIG. 17.

FIG. 18 shows a graph which shows the maximum droplet sizes for Al (melting temperature 660° C.), AlTi (50 wt.-% Al, 50 wt.-% Ti; melting temperature 1500° C.), and Ti (melting temperature 1660° C.) for the arc evaporation method. With increasing Ti content, the droplet size decreases, wherein the droplet size is also influenced by the coating parameters of the arc evaporation method.

The invention claimed is:

1. A piston ring comprising:
a substrate and a wear protection layer applied thereon, the wear protection layer having at least one first element, whose melting point $T_m \leq 700°$ C.,
wherein at least one second element having a melting point $T_m > 760°$ C. is contained in the wear protection layer, and
droplets having a diameter D are present in the wear protection layer, said droplets containing at least the first element, wherein at least 90% of all the droplets in the wear protection layer have a value 1 μm≤D≤10 μm, and the wear protection layer contains no other droplets other than the droplets having a diameter D and containing at least the first element.

2. The piston ring according to claim 1, wherein the first element is selected from aluminum, magnesium, zinc, tellurium, thallium, tin, bismuth, or sulfur.

3. The piston ring according to claim 1, wherein the second element is selected from titanium, vanadium, chromium, zirconium, niobium, molybdenum, hafnium, tantalum, tungsten, iron, silicon, or cerium.

4. The piston ring according to claim 1, wherein the wear protection layer includes at least one metal nitride.

5. The piston ring according to claim 1, wherein the wear protection layer comprises a periodically constructed multi-layer system comprising plural periodicities, wherein each periodicity consists of at least two individual layers made of metal nitrides, and at least one individual layer of the periodicity has at least one of the first elements and at least one of the second elements.

6. The piston ring according to claim 5, wherein the individual layers have nitrides of at least one metal from the group Ti, Zr, Hf, V, Nb, Ta, Cr, Mo and W.

7. The piston ring according to claim 5 wherein one individual layer of the periodicity consists of AlTiN.

8. The piston ring according to claim 5, wherein one individual layer of the periodicity consists of CrN.

9. The piston ring according to claim 5, wherein one of the individual layers of the wear protection layer is made of AlTiN and one of the individual layers of the wear protection layer is made of CrN, the layers of the wear protection layer having 47 to 55 wt.-% Cr, 19 to 25 wt.-% N, 10 to 19 wt.-% Al, and 10 to 14 wt.-% Ti, wherein the wt.-% specifications relate to the wear protection layer.

10. The piston ring according to claim 5 wherein the second element is contained in one of the individual layers of the periodicity at a proportion of 1 to 90 wt.-%.

11. The piston ring according to claim 1, wherein the wear protection layer is applied by means of a cathodic arc evaporation method.

12. The piston ring according to claim 5, wherein the thickness of one of the individual layers is 5 nm to 15 nm.

13. The piston ring according to claim 5, wherein the thickness of one of the individual layers of the multi-layer system is 15 to 500 nm.

14. The piston ring according to claim 1, wherein the thickness of the wear protection layer is 10 to 60 μm.

* * * * *